United States Patent [19]

Doi et al.

[11] Patent Number: 5,679,947
[45] Date of Patent: Oct. 21, 1997

[54] OPTICAL DEVICE HAVING A LIGHT EMITTER AND A PHOTOSENSOR ON THE SAME OPTICAL AXIS

[75] Inventors: Masato Doi; Hironobu Narui; Osamu Matsuda; Kenji Sahara, all of Kanagawa, Japan

[73] Assignee: Sony Corporation, Tokyo, Japan

[21] Appl. No.: 613,858

[22] Filed: Mar. 11, 1996

Related U.S. Application Data

[63] Continuation of Ser. No. 294,307, Aug. 23, 1994, abandoned.

[30] Foreign Application Priority Data

Aug. 25, 1993  [JP]  Japan ............................ 5-210691
Dec. 21, 1993  [JP]  Japan ............................ 5-322629

[51] Int. Cl.$^6$ ............................................. H01J 3/14
[52] U.S. Cl. ................. 250/201.5; 250/216; 369/44.12
[58] Field of Search ......................... 250/201.5, 216; 369/44.12, 44.42

[56] References Cited

U.S. PATENT DOCUMENTS

| | | | |
|---|---|---|---|
| 4,904,856 | 2/1990 | Nagahama et al. | 250/201.5 |
| 4,918,675 | 4/1990 | Lee | 369/13 |
| 5,065,380 | 11/1991 | Yokota | 369/44.12 |
| 5,111,448 | 5/1992 | Komma et al. | 369/44.23 |
| 5,111,449 | 5/1992 | Kurata et al. | 369/44.37 |
| 5,136,152 | 8/1992 | Lee | 257/269 |
| 5,180,909 | 1/1993 | Ohyama et al. | 250/216 |
| 5,293,038 | 3/1994 | Kadowaki et al. | 250/216 |

FOREIGN PATENT DOCUMENTS 0 199 565  10/1986  European Pat. Off. .
0 244 827  11/1987  European Pat. Off. .
0 555 097  8/1993  European Pat. Off. .

OTHER PUBLICATIONS

*Patent Abstracts of Japan*, vol. 11, No. 253, "Integrated Optical Pickup Head", Aug. 18, 1987.

*Patent Abstracts of Japan*, vol. 14, No. 98, "Optical Pickup Device", Feb. 22, 1990.

*Patent Abstracts of Japan*, vol. 15, No. 46, "Optical Integrated Circuit", Feb. 4, 1991.

*Primary Examiner*—Stephone Allen
*Attorney, Agent, or Firm*—Hill, Steadman & Simpson

[57] ABSTRACT

An optical device structure can be simplified and miniaturized on the whole. A fabrication of optical device can be simplified and the optical device can be improved in reliability. The optical device can increase its output, operate a light emitting light source with a reduced power and reduce a power consumption by increasing a quantity of reflected-back light to a photosensor device, i.e., a quantity of photosensed light. An optical device includes a light emitting section (1), a radiated section (2), a converging means (3) and a photosensor section (4). Light emitted from the light emitting section (1) is converged and radiated on the radiated section (2) by the converging means (3). Reflected-back light ($L_R$) reflected from the radiated section (2) is converged and the photosensor section (4) is disposed near a confocal of the converging means (3) concerning reflected-back light from the radiated section (2). Light emitted from the light emitting section (1) is passed through a path of the same axis and photosensed by the photosensor section (4) as shown by a one-dot chain line (a) representing the optical axis before and after the emitted light is reflected by the radiated section (2).

13 Claims, 20 Drawing Sheets

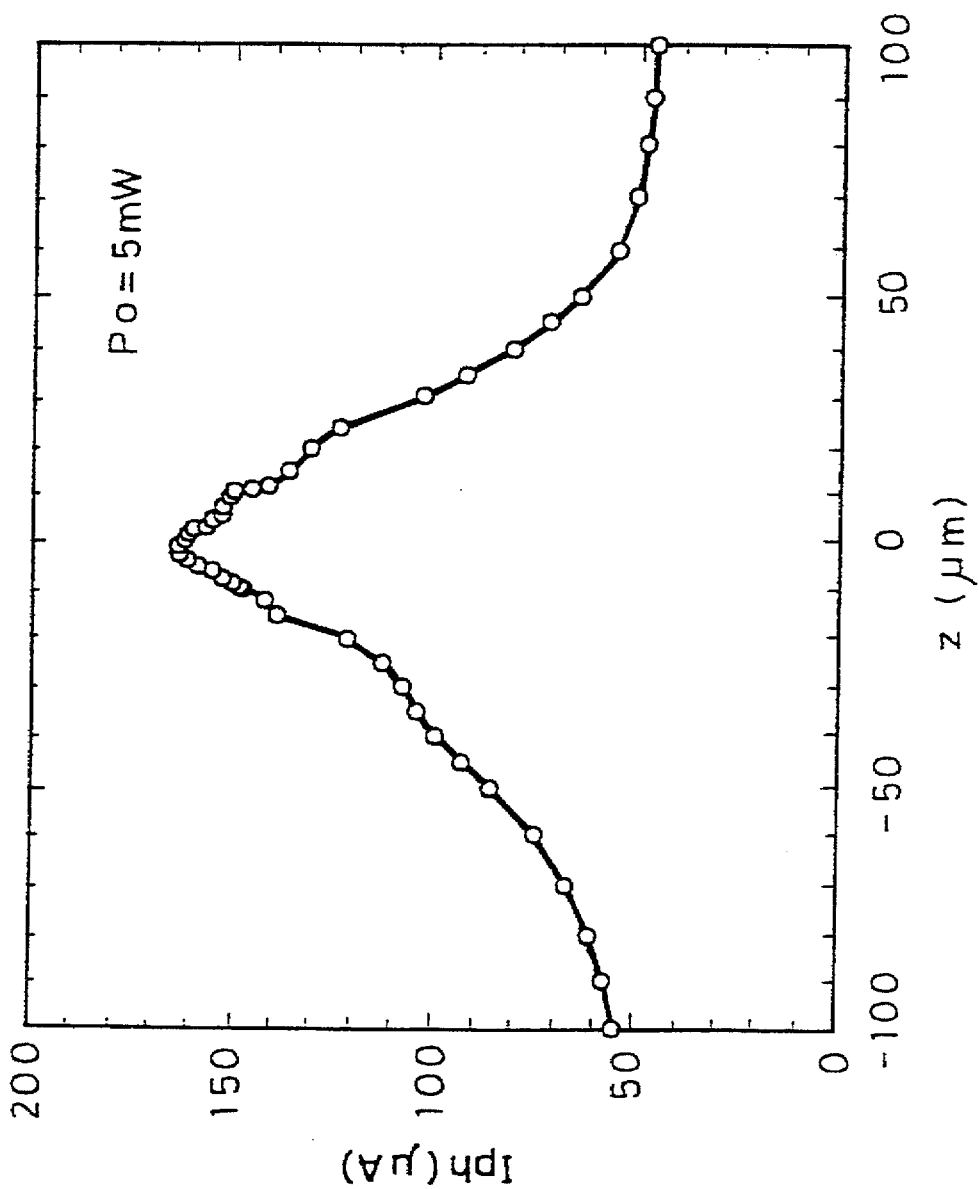

OPTICAL DEVICE HAVING A LIGHT EMITTER AND A PHOTOSENSOR ON THE SAME OPTICAL AXIS

This is a continuation of application Ser. No. 08/294,307 filed Aug. 23, 1994 now abandoned.

BACKGROUND OF THE INVENTION

The present invention relates to an optical device having a photosensor section to detect reflected-back light generated when light from a light source is radiated on and reflected by a radiated section of optical recording media, such as optical disc, magneto-optical disc or the like.

In optical devices, such as optical disc drive of a so-called compact disc (CD) and an optical pickup section of a magneto-optical disc drive, optical parts, such as a grating and a beam splitter, are separately assembled and therefore an overall arrangement thereof becomes complicated. Moreover, since the optical placement setting of these optical parts is cumbersome, optical devices cannot be mass-produced efficiently.

FIG. 1 of the accompanying drawings schematically shows a structure of an example of optical device in an enlarged scale. As shown in FIG. 1, light emitted from a light source 51, such as a semiconductor laser diode or the like, is introduced through a grating 52 to a beam splitter 53, from which separate light beams are converged on an optical disc recording portion of a optical recording medium 56 through a collimator lens 54 by an objective lens 55. A one-dot chain line c in FIG. 1 depicts an optical axis extended from the light source 51 to the optical recording medium 56.

Reflected-back light from the optical recording medium 56 is traveled through the objective lens 55 and the collimator lens 54 and reflected by the beam splitter 53, separated from the optical axis c, traveled through a concave lens 57 and a cylindrical lens 58 disposed on the right-hand side of the beam splitter 53 and converged and detected by a photosensor section, i.e., a photodetector 59, such as a photodiode (PD) or the like.

FIG. 2 shows a structure of another example of optical devices, i.e., an optical pickup section of a reflection type optical scanning microscope. As shown in FIG. 2, light emitted from the light source 51 is reflected by the beam splitter 53 and radiated and converged through the objective lens 55 on the surface of a sample 60. In FIG. 2, reference numeral 61 depicts a focal plane. Then, light reflected on the sample 60 is traveled through the objective lens 55 to the beam splitter 53. Light traveled through a photodetector or a pin-hole 62 disposed at a confocal position is detected by the photodetector 59 disposed behind the pin-hole 62. At that time, it is possible to detect the state of the surface of the sample 60 by either translating a stage (holder) of the sample 60 or by relatively scanning radiation beams on the sample 60 in the direction shown by an arrow s in FIG. 2.

In the optical device of the optical pickup system, in order to avoid the reflected-back light from being returned to the emitted position, the beam splitter is disposed between the light source and the radiated section. Alternatively, as Japanese laid-open patent publication No. 1-303638 describes, a hologram is disposed to separate the reflected-back light from the light path directing the radiated portion, i.e., the reflected-back light returned to the light source. In this case, however, it is unavoidable that a quantity of light detected by the photosensor device is reduced.

Furthermore, as described in Japanese laid-open patent publication No. 2-278779, if the above-mentioned optical pickup device is fabricated on the same semiconductor substrate, such as a silicon (Si) substrate or the like, in a hybrid fashion, then the optical pickup device should be assembled with highest alignment accuracy.

SUMMARY OF THE INVENTION

In view of the aforesaid aspect, it is an object of the present invention to provide an optical device in which an optical pickup system can be simplified in structure.

It is another object of the present invention to provide an optical device in which an overall structure can be miniaturized.

It is still another object of the present invention to provide an optical device in which a fabricating process can be simplified.

It is still another object of the present invention to provide an optical device which can be improved in reliability.

It is a further object of the present invention to provide an optical device in which a light source can emit light with low power and light can be emitted at a reduced power consumption by increasing a quantity of reflected-back light to a photosensor section, i.e., a quantity of detected light.

According to a first aspect of the present invention, there is provided an optical device which comprises a light emitting section, a radiated section, a converging means, and a photosensor section, wherein light emitted from the light emitting section is converged and radiated on the radiated section by the converging means, the photosensor section is disposed near a confocal of the converging means concerning reflected-back light from the radiated section, and light from the light emitting section is passed through a path of the same axis and photosensed by the photosensor section before and after the light is reflected on the radiated section.

According to a second aspect of the present invention, there is provided an optical device which comprises a light emitting section, a radiated section, a converging means, a photosensor section, and a magneto-optical signal detecting means, wherein light emitted from the light emitting section is converged and radiated on the radiated section by the converging means, reflected-back light reflected on the radiated section is converged by the converging means, the photosensor section is disposed near a confocal of the converging means concerning reflected-back light from the radiated section, and light from the light emitting section is passed through a path of the same axis and photosensed by the photosensor section before and after the light is reflected on the radiated section.

As a third aspect of the present invention, an optical device comprises a light emitting section, a photosensor section, and a common substrate in which the light emitting section and the photosensor section are integrally formed, wherein the light emitting section includes a semiconductor laser having-a horizontal resonator and a reflection mirror, the photosensor section is formed of a photodiode and at least a part of a photosensor screen of the photosensor section is disposed within a diffraction limit of a reflected-back light.

BRIEF DESCRIPTION OF THE DRAWINGS

FIG. 9 is a diagram of a characteristic curve obtained when a current is detected by the photosensor section while a position of a radiated section is elevated and lowered;

DETAILED DESCRIPTION OF THE PREFERRED EMBODIMENTS

The present invention will now be described below in detail with reference to the drawings.

Figure 1:
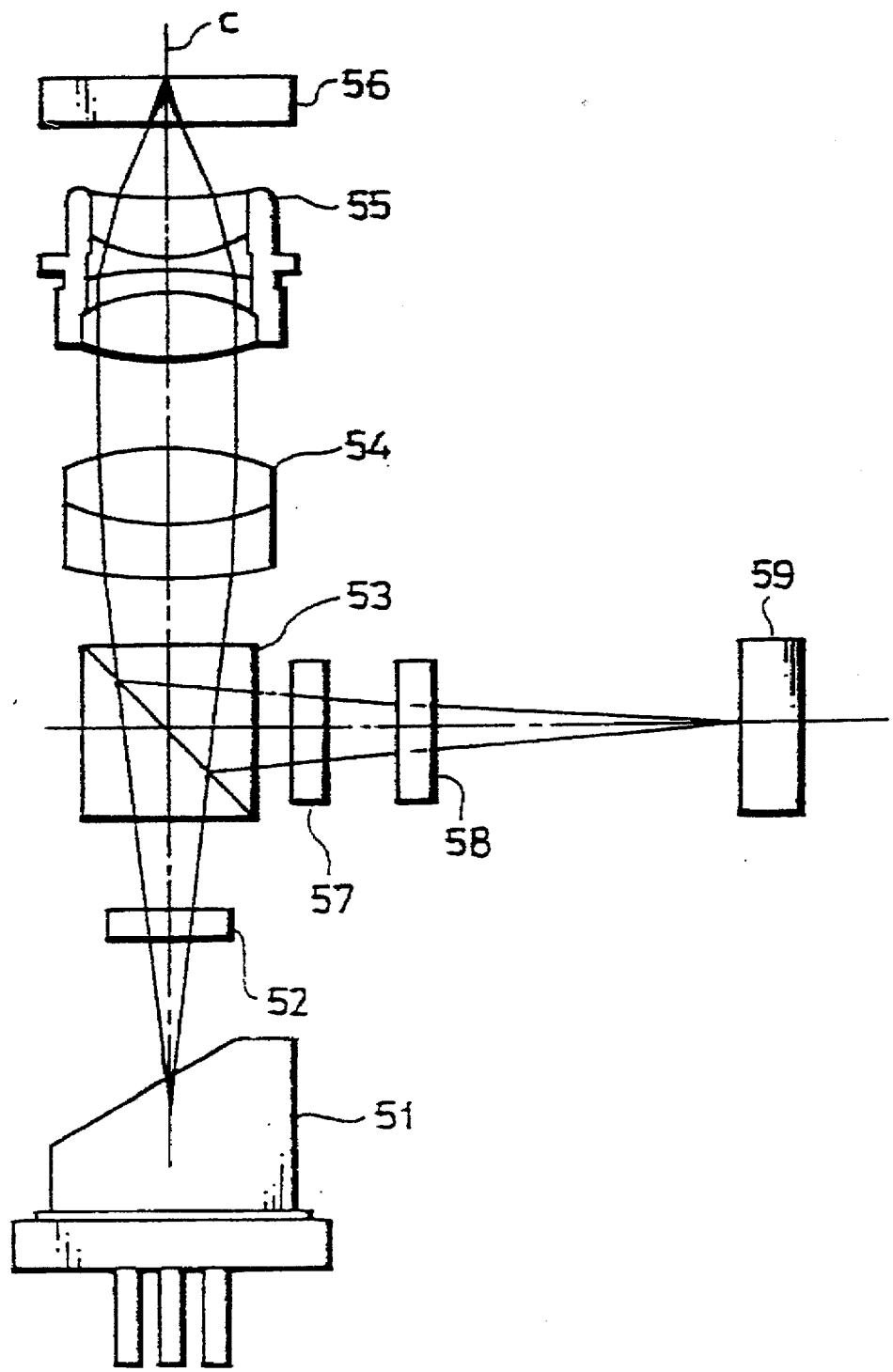
FIG. 1 is a diagram schematically showing a structure of an example of an optical device in an enlarged scale.
Figure 2:
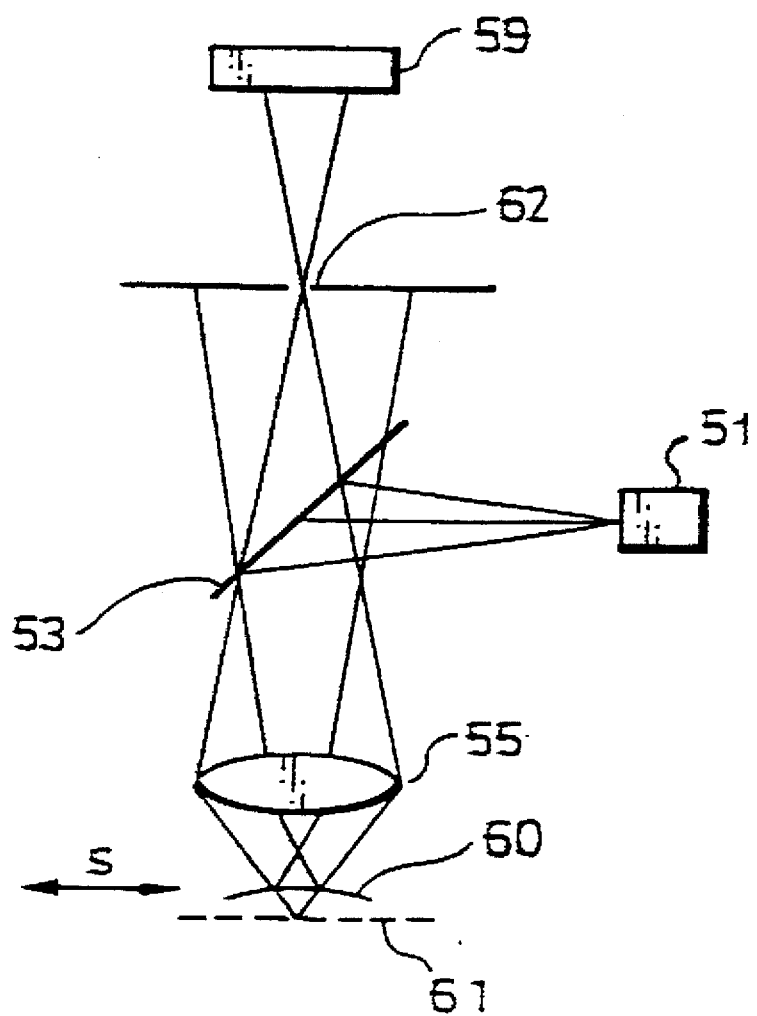
FIG. 2 is a diagram schematically showing a structure of another example of an optical device.
Figure 3:
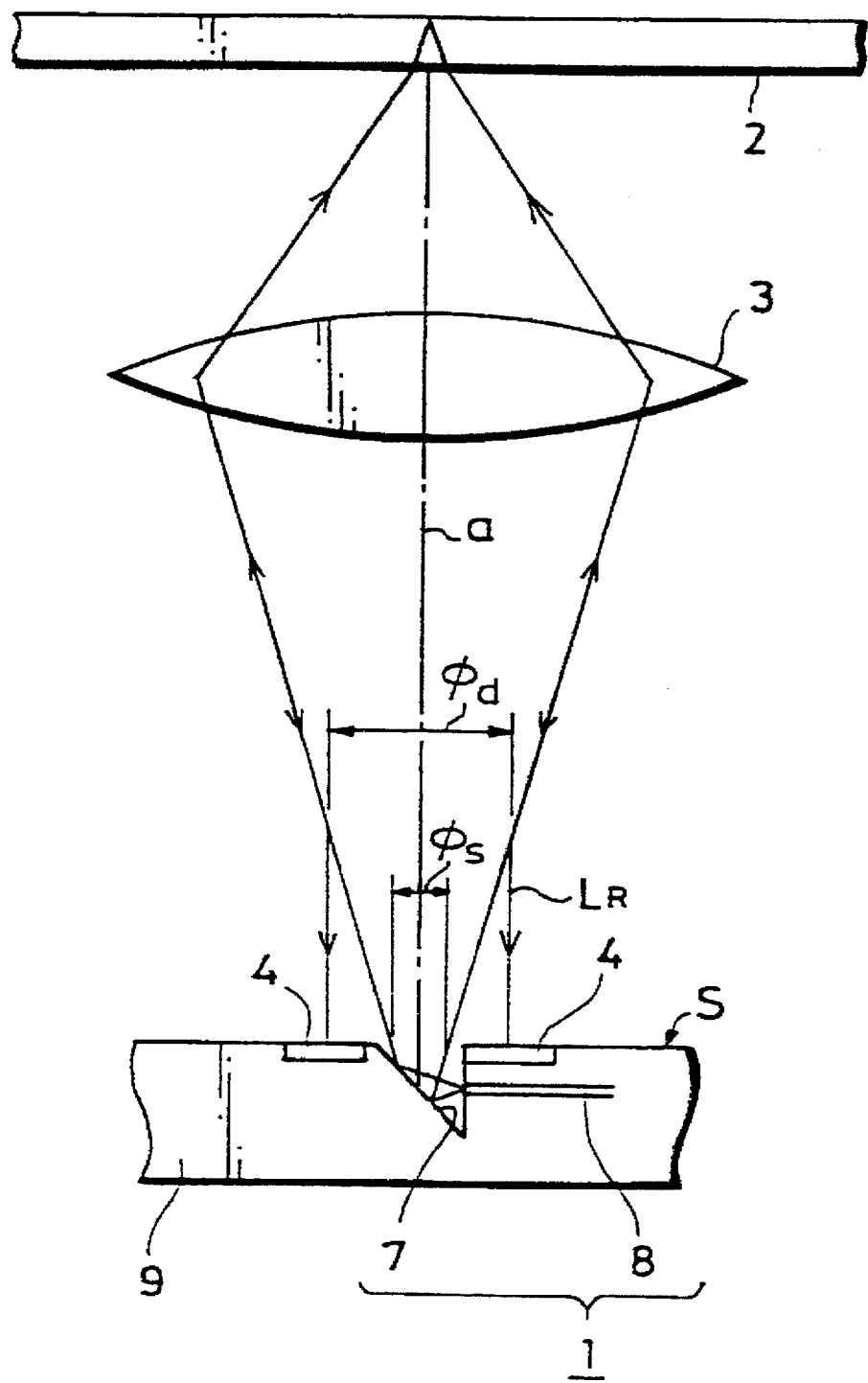
FIG. 3 is a diagram showing a structure of an optical device according to an embodiment of the present invention.

FIG. 3 shows a structure of an optical device which is applied to an optical pickup device in which the radiated portion 2 is an optical recording medium, e.g., optical disc in which recording information is recorded in the form of concave and convex pits and in which recorded information is reproduced by an intensity of reflected light reflected by a diffraction of light caused in the pits irradiated with read-out light.

As shown in FIG. 3, the optical pickup device according to the present invention comprises a light emitting section 1, the radiated section 2 formed of the optical disc, a converging means 3 and a photosensor section 4. The converging means 3 converges light emitted from the light emitting section 1 on the radiated section 2 and also converges reflected-back light reflected from the radiated section 2. The photosensor section 4 is disposed near the confocal concerning the reflected-back light from the radiated section 2 of the converging means 3. Before and after light emitted from the light emitting section 1 is reflected on the radiated section 2, as the optical axis of the emitted light is illustrated by a one-dot chain line a in FIG. 3, the emitted light is passed through the light path (path) of the same axis and photosensed by the photosensor section 4.

As shown in FIG. 3, the light emitting section 1 and the photosensor section 4 are integrally fabricated on a common substrate 9. In this embodiment, the light emitting section 1 is composed of a semiconductor laser 8 having a horizontal resonator and a reflection mirror 7. The photosensor section 4 is formed of a photodiode. The semiconductor laser 8 includes the horizontal resonator as described above and light emitted from the semiconductor laser 8 is reflected by the reflection mirror 7 so that the reflected light coincides with the light path directed toward the radiated section 2.

Reflected-back light $L_R$ traveled toward the photosensor section 4 is converged near the diffraction limit. The photosensor section 4 is disposed at the position such that at least a part of the photosensor screen thereof falls within the diffraction limit, i.e., a distance from the optical axis a of the light emitted from the light emitting section 1 and which intersects the placement reference plane S of the photosensor screen falls within $1.22\lambda/NA$ where $\lambda$ is the wavelength of the light emitted from the light emitting section 1 and NA is the numerical aperture of the converging means 3.

Figure 4:
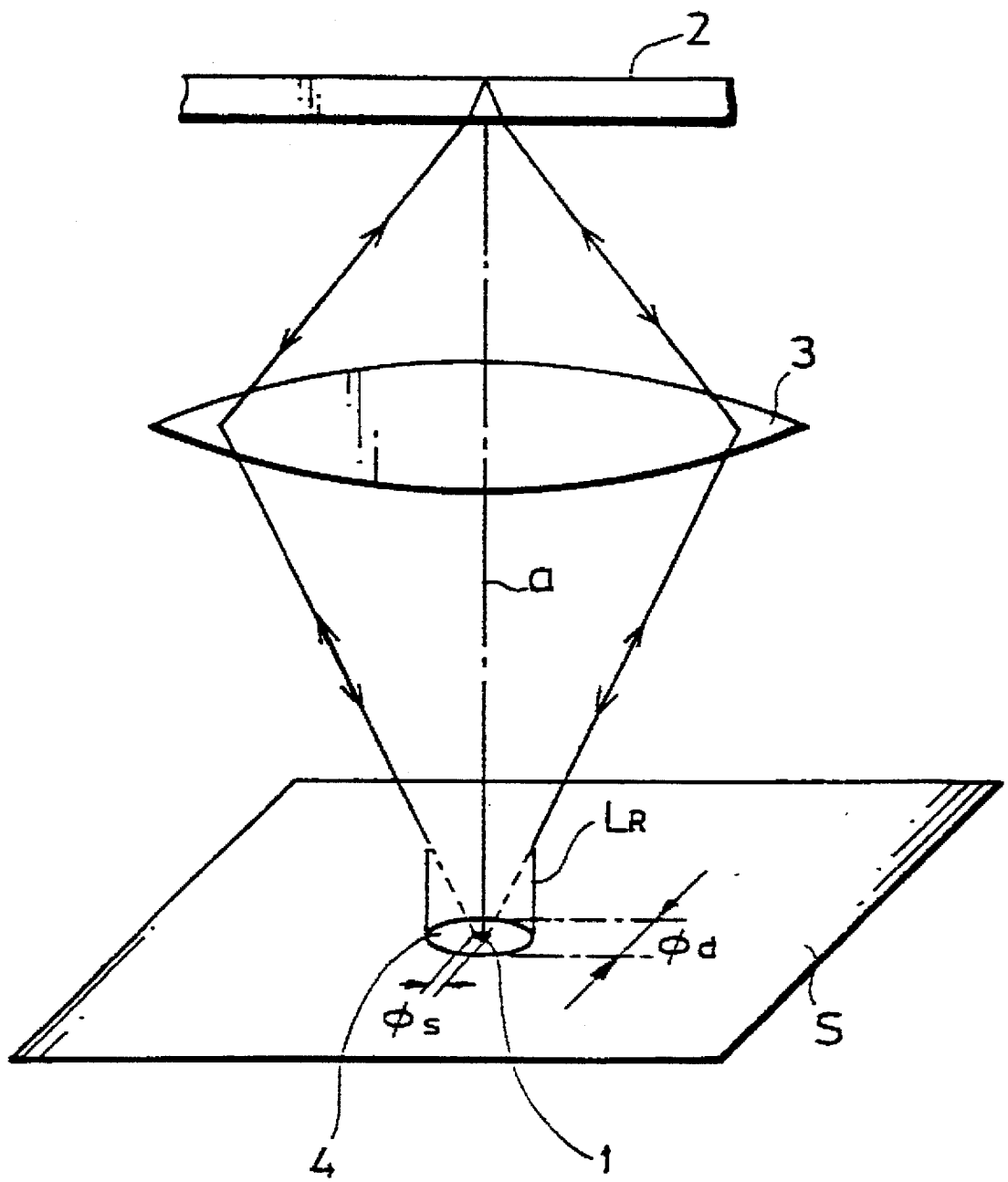
FIG. 4 is a diagram schematically showing a structure of the optical device according to other embodiment of the present invention.

In this case, as shown in FIGS. 3 and 4, a diameter $\phi s$ of the light emitted from the light emitting section 1 on the placement reference plane S of the photosensor screen of the photosensor section 4 is selected to be smaller than a diameter $\phi d$ of the diffraction limit and the effective photosensor screen of the photosensor section 1 is located outside the diameter $\phi s$ of the emitted light. If the semiconductor laser is used as the light source of the light emitting section 1, then the diameter $\phi s$ of the emitted light can be limited to about 1 to 2 μm. On the other hand, when the numerical aperture NA of the converging means 3 is about 0.09 to 0.1 and the wavelength $\lambda$ of the emitted light is about 780 nm, the diffraction limit, i.e., $\phi d$ becomes about $1.22\lambda/NA = 10$ μm.

The light emitting section 1 is disposed at one focal position of the converging means 3. Specifically, a waist of light emitted from the semiconductor laser is located at the confocal position. The radiated section 2 is located at the other focal point of the converging means 3.

With this arrangement, the light emitted from the light emitting section 1 is radiated on the optical disc of the radiated section 2 disposed at the confocal position through the converging means 3, i.e., converging optical lens. Accordingly, the light that was radiated on and reflected by the optical disc, i.e., reflected-back light containing recorded information is converged again by the converging means 3 and introduced into the photodiode of the photosensor section 4 disposed near the confocal position. Thus, the reflected-back light is photosensed and detected by the photosensor section 4, i.e., converted into an electrical signal and obtained as a reproduced signal.

At that time, if the photosensor screen of the photodiode of the photosensor section 4 is disposed at the position including an area in which a distance from the optical axis a is larger than $\phi s/2$ and falls within at least $\phi d/2$, then the reflected-back light from the radiated section 2, i.e., optical disc can reliably be separated from the emitted light and detected by the photosensor section 4.

While the radiated section 2 is the optical disc, for example, as described above with reference to FIG. 3, the present invention is not limited thereto and the optical device according to the present invention can be applied to the optical pickup device in which the radiated section 2 is a magneto-optical disc, for example, and a signal that was magnetically recorded on the magneto-optical disc is read out based on Kerr effect.

Figure 5:
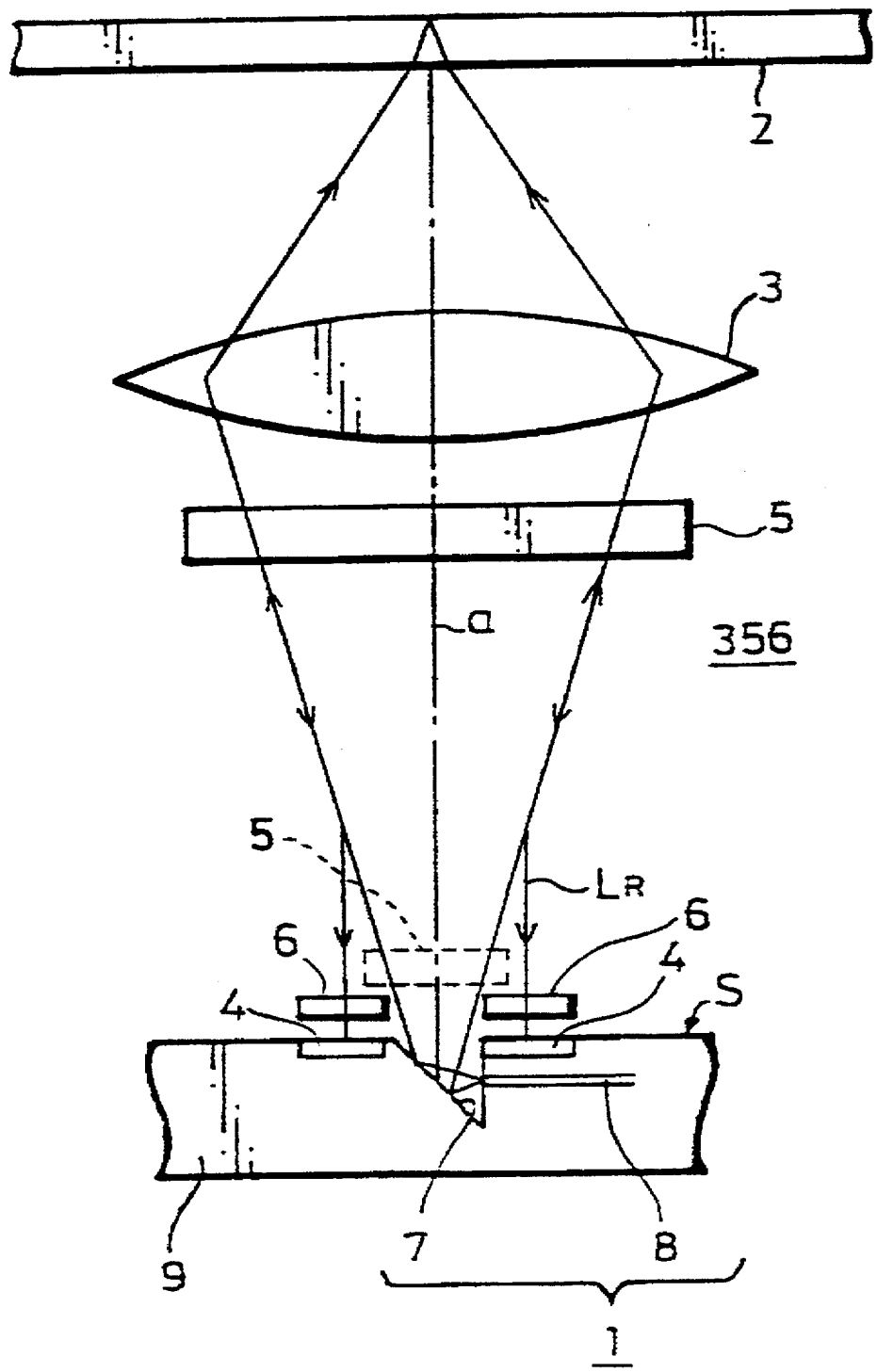
FIG. 5 is a diagram schematically showing a structure of the optical device according to other embodiment of the present invention.

FIG. 5 schematically shows a structure of an example of the above-mentioned optical pickup device. In this case, the optical pickup device includes magneto-optical signal detecting means 356. The magneto-optical signal detecting means 356 includes either a polarizing means or an analyzing means. In the example shown in FIG. 5, a polarizing means 5 that is what might be a polarizer is disposed between the light emitting section 1 and the radiated section 2, i.e., at the position shown by a solid line or broken line in FIG. 5 on the light path extended from the light emitting section 1 to the radiated section 2 and the light path in which light is reflected back from the radiated section 2. On the other hand, the analyzing means 6 that is what might be called an analyzer is disposed at the position which avoids the light path of the light emitted from the light emitting section 1 on the photosensor section 4 in an opposing relation to the polarizer 5.

With the above-mentioned arrangement, since the light radiated on the magneto-optical disc of the radiated section 2 whose polarizing plane was rotated based on the Kerr effect corresponding to the recorded information is returned as the reflected-back light, a quantity of light that passes the polarizer means 6 is changed in response to a Kerr rotational angle. Therefore, if this change of quantity of light is detected by the photosensor section 4, then recorded information on the magneto-optical disc can be reproduced.

Figure 6:
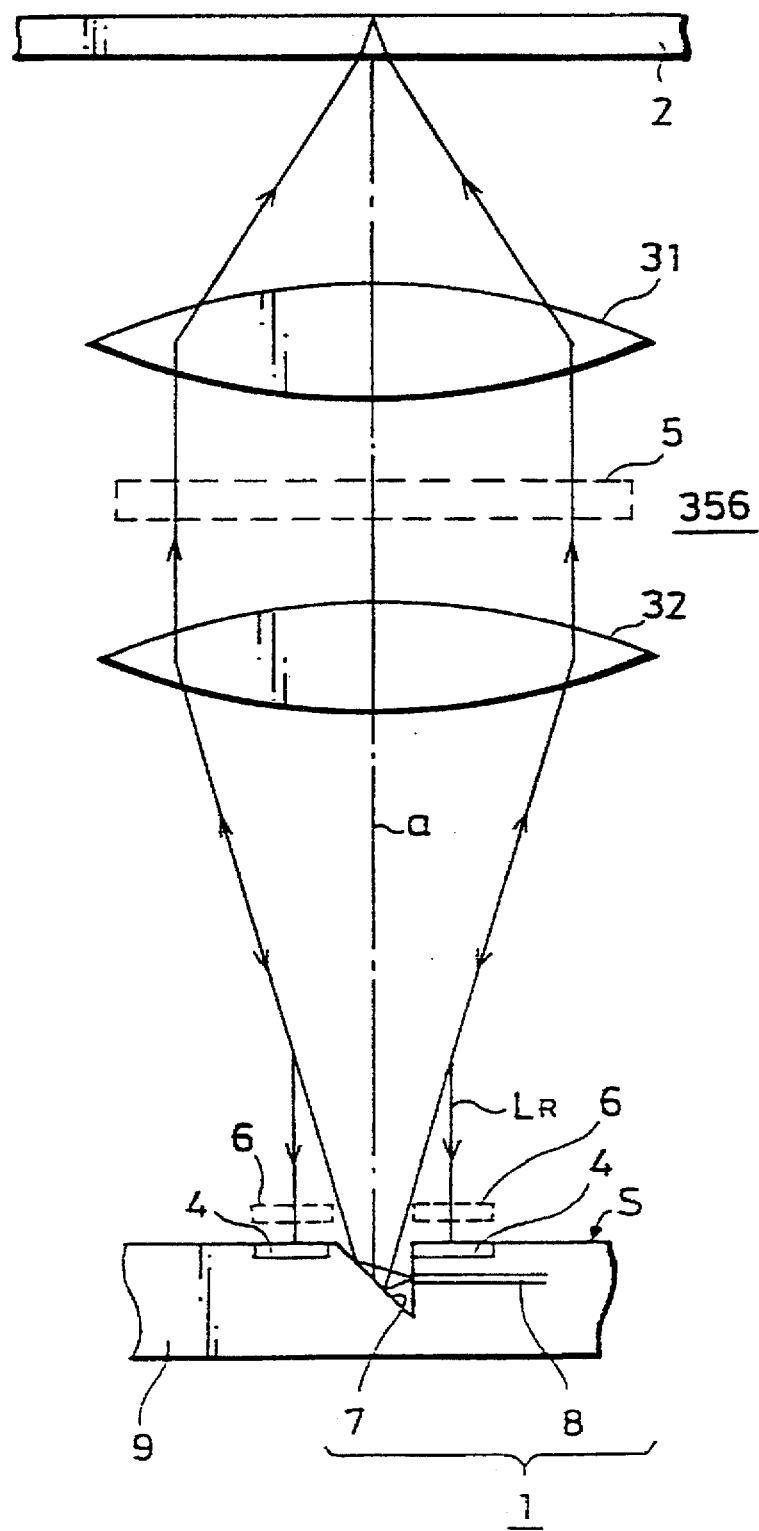
FIG. 6 is a diagram schematically showing a structure of the optical device according to other embodiment of the present invention.

As shown in FIG. 6, if the converging means is formed as a collimator lens composed of first and second converging means 31, 32, then it is possible to facilitate the design of the optical system, such as the setting of optical path length or the like. When the converging means is composed of the first and second converging means 31 and 32, the polarizer means 5 can be disposed between the first and second converging means 31 and 32.

When the converging means is composed of the first and second converging means 31 and 32, at least a part of the photosensor section 4 should be disposed in the area in which the distance from the optical axis of the emitted light intersecting the placement reference plane S of the photosensor screen falls within $1.22\lambda/NA$ where $\lambda$ is the wavelength of the light emitted from the light emitting section 1 and NA is the numerical aperture of the second converging means 32.

In the above-mentioned embodiments, the light emitting section 1 and the photosensor section 4 can satisfactorily be set in a predetermined positional relationship with ease reliably if the light emitting section 1 and the photosensor section 4 are integrally fabricated on the common substrate 9.

An example that the light emitting section 1 and the photosensor section 4 are fabricated on the common substrate 9 as a monolithic structure will be described below with reference to FIGS. 7A through 7D and FIGS. 8A to 8C together with an example of a fabrication method in order to facilitate the understanding of the present invention.

Figure 7A:
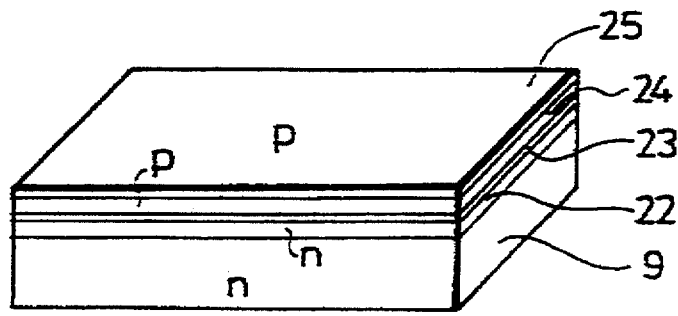
FIGS. 7A through 7D are process diagrams used to explain an example of a method of fabricating a light emitting section and a photosensor section of the optical device according to the present invention, respectively.

As shown in FIG. 7A, there is prepared the substrate 9 formed of a first conductivity type, e.g., n-type GaAs or InP compound semiconductor substrate on which an AlGaAs first cladding layer 22 of first conductivity type, n-type, a GaAs or AlGaAs active layer 23 which is lightly-doped by Al (aluminum) as compared with the first cladding layer 22, an AlGaAs second cladding layer 24 of second conductivity type, e.g., p type and a GaAs capping layer 25 of the same conductivity type are epitaxially grown by MOCVD (metal organic chemical vapor deposition), in that order.

Figure 7B:
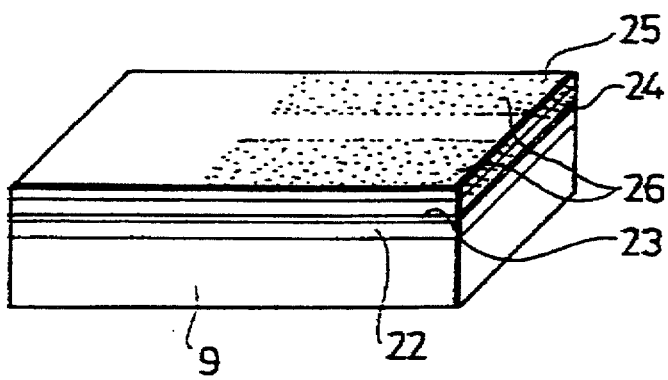

As shown in FIG. 7B, current blocking regions 26 are formed on the capping layer 25 so as to sandwich a region in which a resonator of a semiconductor layer is finally formed by ion-implantation of impurity of first conductivity type, e.g., n type.

Figure 7C:
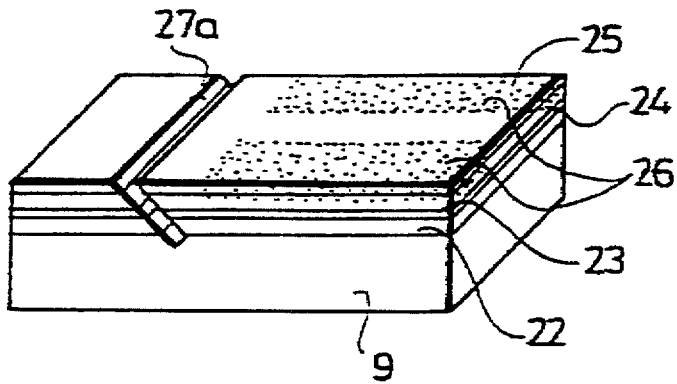

As shown in FIG. 7C, a striped oblique groove 27a of a depth reaching the substrate 9 is formed on the surface in the direction inclined at an angle of substantially 45° by anisotropy etching, such as RIE (reactive ion etching) or the like.

Figure 7D:
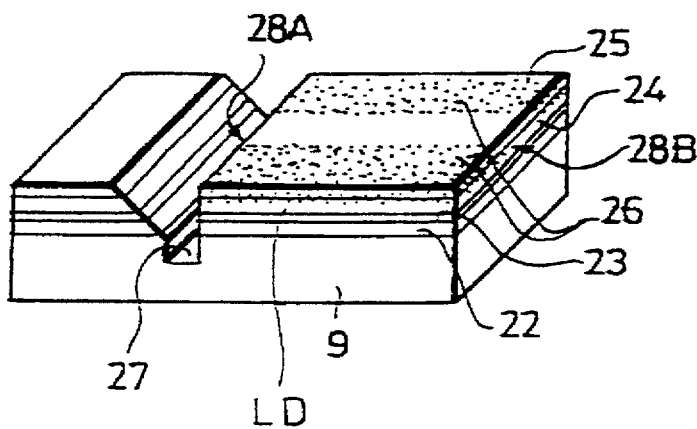

Further, as shown in FIG. 7D, a striped vertical groove 27 with a width of several micrometers is formed near the oblique groove 27a along the striped direction of the oblique groove 27a in the direction perpendicular to the substrate surface with substantially the same depth as that of the substrate 9 by anisotropy etching, such as RIE or the like. In this way, one resonator end face 28A of the semiconductor laser is formed by the inner side surface of the vertical groove 27 opposite to the oblique groove 27a. Another resonator end face 28B also is formed by the surface that is processed by anisotropy etching, such as RIE or the like. Thus, there is obtained a semiconductor laser LD in which a horizontal resonator is constructed between the two end faces 28A and 28B.

Figure 8A:
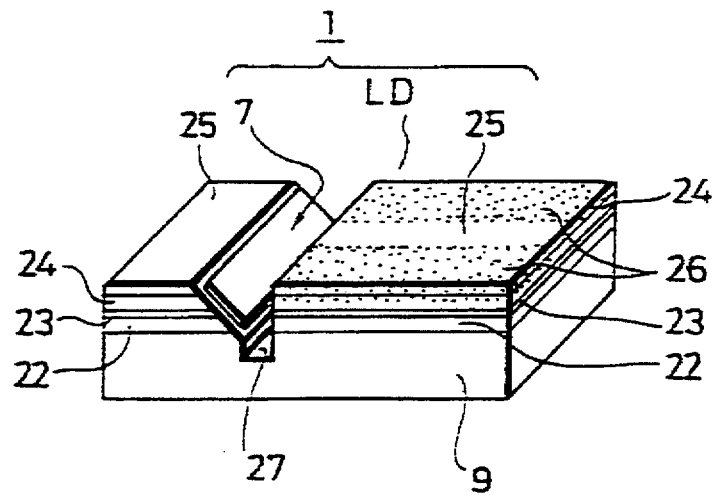
FIGS. 8A through 8C are process diagrams used to explain another example of a method of fabricating the light emitting section and the photosensor section of the optical device according to the present invention, respectively.

Subsequently, as shown in FIG. 8A, a reflection mirror 7 is formed by depositing a reflection film formed of a metal film or a dielectric multilayer film on the oblique groove 27a on its inclined plane opposite to the side in which the vertical groove 27 is disposed, thereby constructing the light emitting section 1 including the semiconductor laser LD and the reflection mirror 7.

Figure 8B:
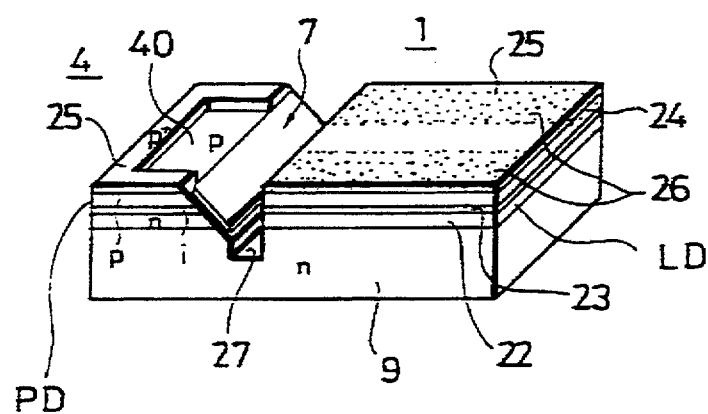

The photosensor section 4 is formed at the position near the light emitting section 1. The photosensor section 4 can be formed on a semiconductor laminated portion which opposes the light emitting section 1, i.e., the semiconductor laser LD across the groove 27. Specifically, as shown in FIG. 8B, a window portion 40 is formed by removing a part of the capping layer 25 of the semiconductor laminated portion opposing the semiconductor laser LD across the groove 27. The photosensor section 4 is formed of the photodiode PD having the window portion 40 as the photosensor surface.

Figure 8C:
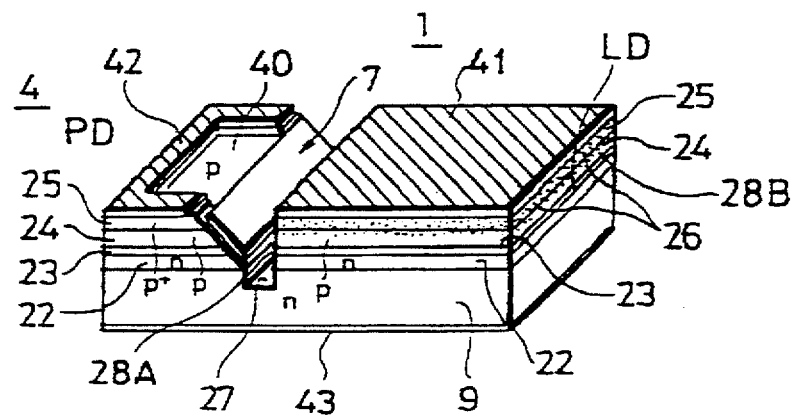

Then, as shown in FIG. 8C, electrodes 41 and 42 of the semiconductor laser LD and the photodiode PD are respectively deposited on the capping layers 25 of the semiconductor laser LD and the photodiode PD in ohmic contact. Another electrode 43 that is common to the semiconductor laser LD and the photodiode PD is deposited on the substrate 9 side in ohmic contact.

In this manner, on the same substrate 9 is formed a structure in which the light emitting section 1 composed of the semiconductor laser LD and the reflection mirror 7 disposed on the horizontal resonator on its light emitting end face, i.e., the resonator end face 28A and the photosensor section 4 formed of the photodiode PD are fabricated integrally in a monolithic fashion.

When the light emitting section 1 and the photosensor section 4 are fabricated on the common (same) semiconductor substrate 9, a spacing between the light emitting section 1 and the photosensor section 4 can be reduced to about several micrometers. Further, since the optical device according to the present invention includes the reflection mirror 7, the light emitting position can be made sufficiently close to the photosensor section 4 substantially. Furthermore, the positional relationship between the light emitting section 1 and the photosensor section 4 can be set accurately, and the optical device according to the present invention can reliably be mass-produced.

When the semiconductor laser is used as the light source of the light emitting section 1, the diameter φs of the light emitted from the light emitting section 1 can be suppressed to 1 to 2 μm or smaller. If the numerical aperture NA of the converging means ranges from about 0.09 to 0.1 and the wavelength λ is about 780 nm, then the diameter φd of the reflected-back light becomes comparatively as large as 8 to 10 μm. Therefore, since the width of the groove 27 can be selected in the order of several micrometers, the reflected-back light can be separated from the emitted light and can be photosensed effectively.

Figure 10:
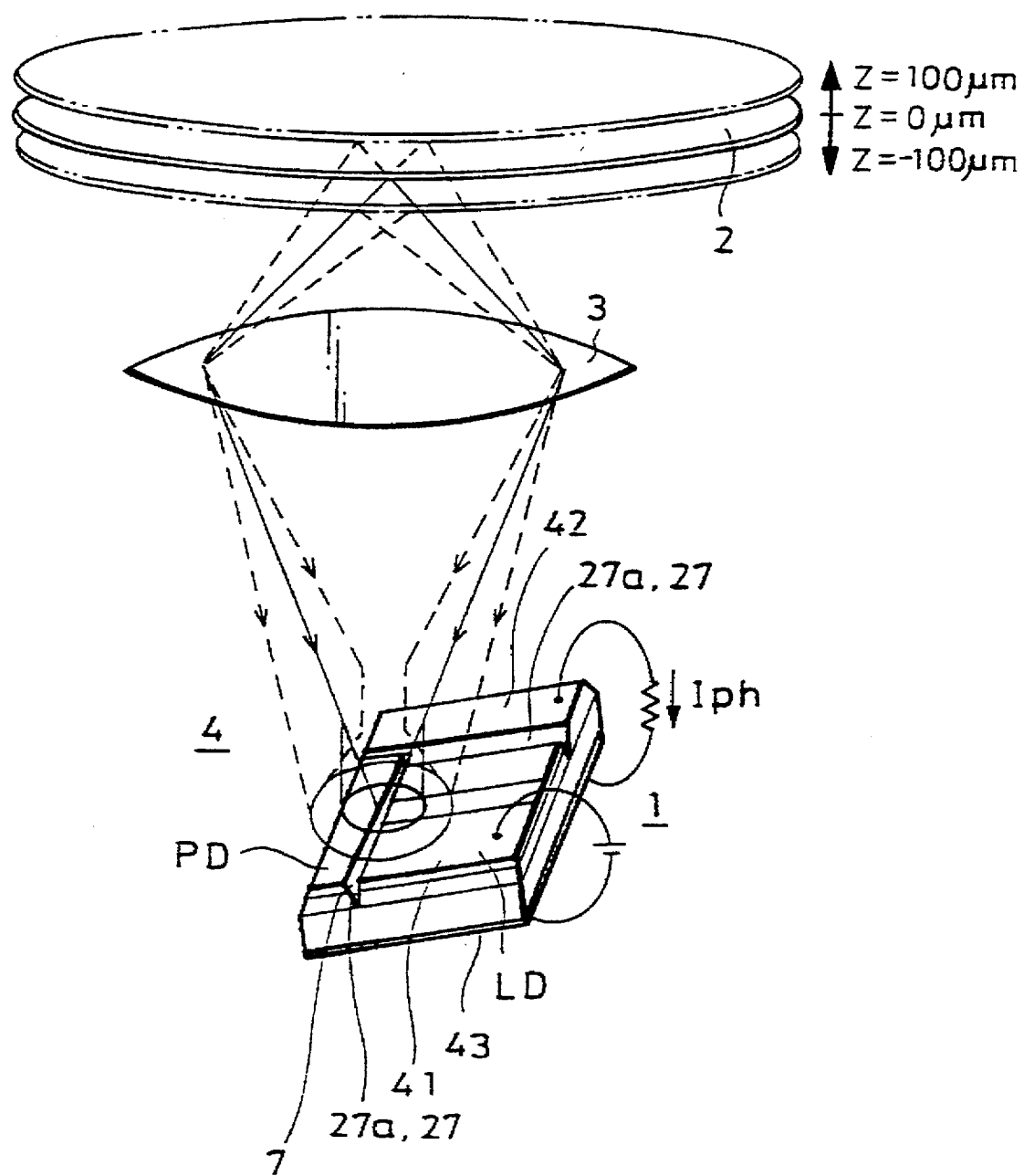
FIG. 10 is a diagram showing the condition that the current is detected by the photosensor section as shown in FIG. 9.

FIG. 9 shows measured results of a detected current Iph detected by the photodiode PD when a power Po of the semiconductor laser LD of the light emitting section 1 is set to 5 mW. As shown in FIG. 10, the grooves 27a, 27 shown in FIGS. 7A through 7D and FIGS. 8A to 8C are formed in stripe along the plane on which the reflection mirror 7 is formed. Also, the grooves 27a, 27 are formed in L-shaped pattern bent from the end portion of the striped portion and an upper electrode 42 of the photodiode PD is extended on the semiconductor layer section separated by this bent portion from the light emitting section 1. A position at which the radiated section 2 is disposed at the confocal position of the converging means 3 is set to z=0. Then, positions and detected current Iph were respectively measured when the radiated section 2 is elevated and lowered by 100 μm each along the incident and reflection optical axis direction perpendicular to the radiated section 2. In this case, although the inclination of the substrate 9 is selected such that an optical axis of laser light emitted when light is reflected by the reflection mirror 7 whose inclination angle relative to the plate plane of the substrate 9 is deviated from 45° becomes perpendicular to the plane of the radiated section 2, the reflected-back light from the reflection mirror 7 becomes incident on the photosensing screen of the photodiode PD with an inclination, whereby the effective photosensing area of the photodiode PD is increased to increase the quantity of photosensed light.

While the reflection mirror 7 is formed on the inner side surface of the inclined groove 27a formed by RIE as shown in FIGS. 7A through 7D and FIGS. 8A to 8C, if some problems occur in the surface property of the reflection mirror 7, then it is possible to form a reflection mirror with excellent surface morphology and with accurate angle by forming the plane with a specified crystal plane. An example thereof will be described below together with a fabrication method thereof. In this case, the reflection mirror 7 can be fabricated by selective MOCVD.

Figure 11A:
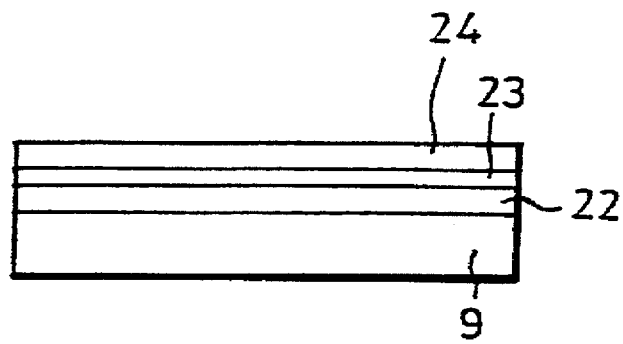
FIGS. 11A through 11C are process diagrams used to explain an example of a method of fabricating the light emitting section and the photosensor section of the optical device according to the present invention, respectively.

As shown in FIG. 11A, semiconductor layers constituting the semiconductor laser are epitaxially grown on the substrate 9 formed of a GaAs substrate of a first conductivity type, e.g., n type whose major surface is (100) crystal plane. Specifically, there is formed a laminated semiconductor layer in which the AlGaAs first cladding layer 22 of the same conductivity type as that of the substrate 9, the GaAs active layer or AlGaAs active layer 23 and the second cladding layer of second conductivity type different from that of the first cladding layer 22, i.e., p type are epitaxially grown on the GaAs substrate by a suitable method, such as MOCVD or the like, in that order.

Figure 11B:
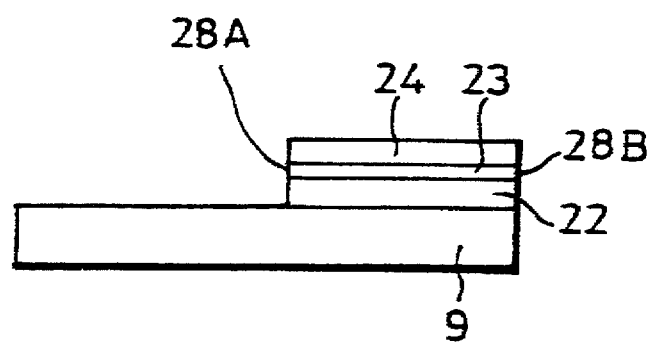

As shown in FIG. 11B, a part of the epitaxially-grown semiconductor layers 24, 23 and 22 is left as the semiconductor laser LD and at least a portion in which the reflection mirror 7 is finally formed is etched by a suitable process, such as RIE or the like. Then, the semiconductor layer end face formed of the etching surface is used as one resonator end face 28A of the semiconductor laser LD and the face opposing the end face 28A is similarly formed as another resonator end face 28B by RIE. The horizontal resonator of the semiconductor laser is constructed between the two end faces 28A and 28B. In this case, similarly to FIG. 7B, a current blocking layer, i.e., current blocking region is formed by implanting impurity ions, though not shown.

Figure 11C:
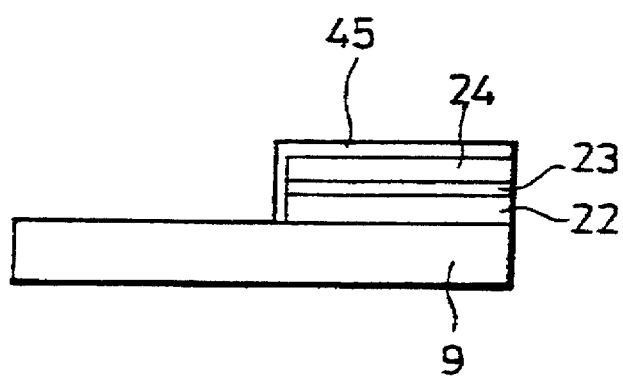

Then, as shown in FIG. 11C, a mask layer 45, e.g., insulating layer, such as $SiO_2$ layer and SiN layer is deposited to cover the laminated semiconductor layer left on the substrate 9, i.e., the portion in which the semiconductor laser LD is formed by selective MOCVD.

Figure 12A:
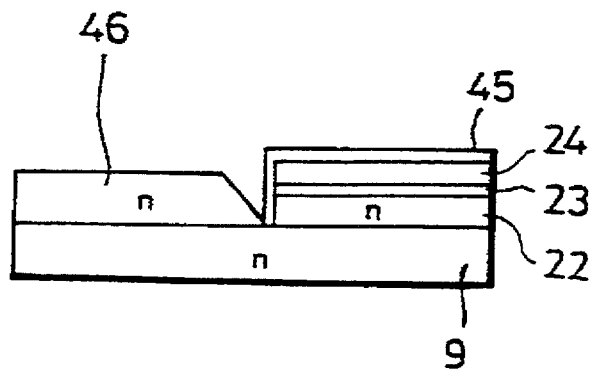
FIGS. 12A through 12C are process diagrams used to explain other example of a method of fabricating the light emitting section and the photosensor section of the optical device according to the present invention, respectively.

As shown in FIG. 12A, a GaAs first semiconductor layer 46 of a first conductivity type, e.g., n type is formed on the substrate 9 at its portion which is not covered with the mask layer 45 by selective MOCVD.

Figure 12B:
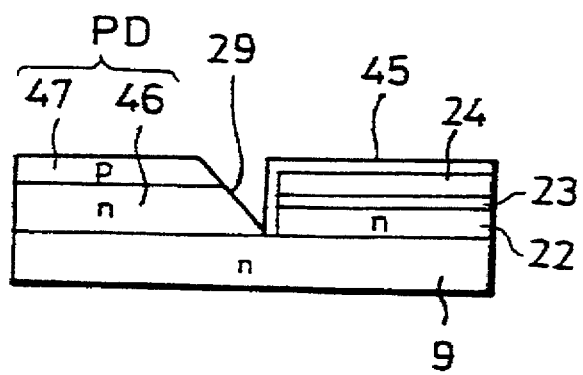

Subsequently, as shown in FIG. 12B, a GaAs second semiconductor layer 47 of a second conductivity type, e.g., p type is formed by selective MOCVD and the photodiode PD is formed by the first and second semiconductor layers 46, 47.

Figure 12C:
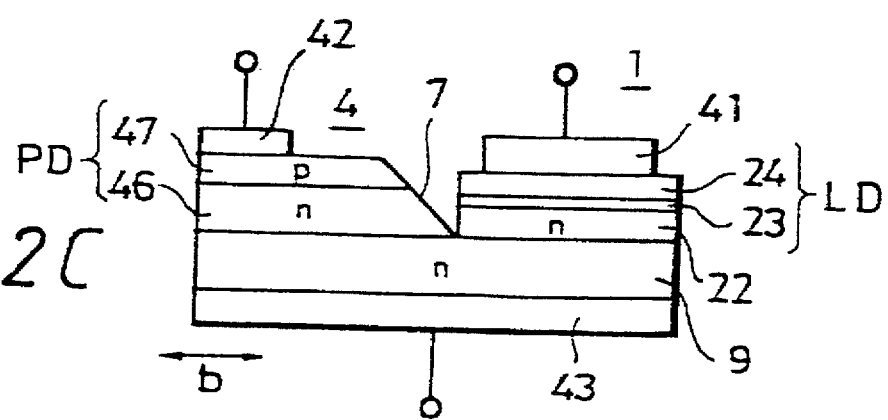

As shown in FIG. 12C, the mask layer 45 is removed by etching, and electrodes 41, 42 of the semiconductor laser LD and the photodiode PD are deposited on the semiconductor laser LD and a part of the second semiconductor layer 46 in ohmic contact fashion. A common electrode 43 is deposited on the rear surface of the substrate 9 in ohmic contact fashion.

A plane 29 in which the semiconductor layers that are epitaxially grown on the substrate 9 shown in FIG. 12B by selective MOCVD, in this embodiment, the first and second semiconductor layers 46, 47 are opposed to the resonator end face 28A is served as a specified crystal plane. When the resonator length direction of the horizontal resonator of the semiconductor laser fabricated between the semiconductor laser end faces 28A and 28B, i.e., direction shown by an arrow b in FIG. 12C is set to [011] crystal axis direction, the opposing plane 29 is produced as a {111}A inclined plane. When the arrow b direction is set to [0-11] crystal axis direction, the opposing plane 29 is produced as a {111}B inclined plane. Any of the {111}A and {111}B inclined planes provides an angle of 54.7° relative to the plane surface of the substrate 9. When the arrow b direction is set to a [100] crystal axis direction, the opposing plane 29 is produced as a {110} inclined plane and formed as an inclined plane with an angle of 45° relative to the plate surface of the substrate 9 and whose morphology based on atomic plane is excellent.

Accordingly, the inclined plane 29 based on the specified crystal plane can be used as the reflection mirror 7 which reflects light emitted from the horizontal resonator end face 28A of the semiconductor laser in a predetermined direction, as shown in FIG. 12C. According to this structure, since the reflection mirror 7 is formed by the crystal plane, the reflection mirror 7 is excellent in specular characteristics and the inclination angle of the reflection mirror 7 can be set with accuracy.

Figure 13A:
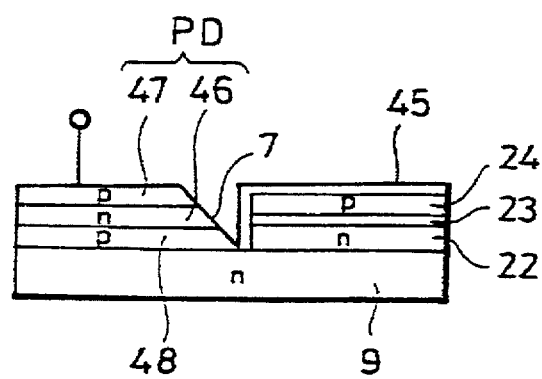
FIGS. 13A and 13B are process diagrams used to explain other example of a method of fabricating the light emitting section and the photosensor section of the optical device according to the present invention, respectively.
Figure 13B:
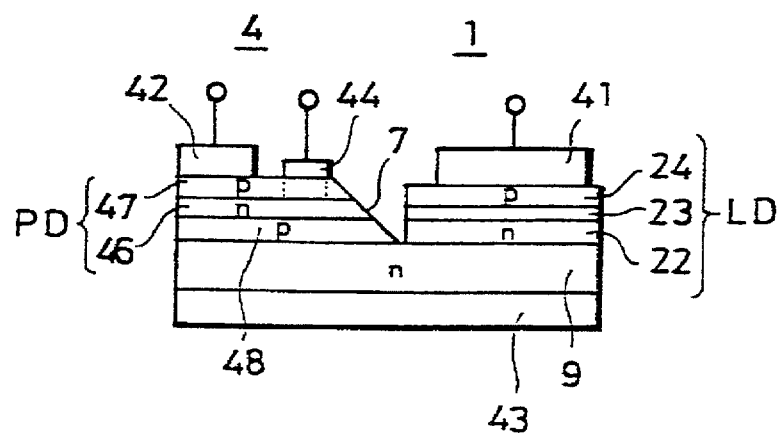

While the photodiode PD is composed of the semiconductor layer 46 of the same conductivity type as that of the substrate 9, i.e., n type and the semiconductor layer 47 of the different conductivity type, i.e., p type that are epitaxially grown in the substrate 9 in that order as shown in FIGS. 12A to 12C, the present invention is not limited thereto and the following variant also is made possible in order to reduce a crosstalk generated between the photodiode PD and the semiconductor laser LD. After the processes shown in FIGS. 11A to 11C, as shown in FIG. 13A, prior to the process in which the semiconductor layers 46, 47 are epitaxially grown, a semiconductor layer 48 of a second conductivity type different from that of the substrate 9, i.e., p type is epitaxially grown and then the semiconductor layers 46, 47 fabricating the photodiode PD can be epitaxially grown through the p-type semiconductor layer 48. A part of the lower semiconductor layer 46 is exposed to the outside by removing a part of the upper semiconductor layer 47 by etching and an electrode 44 is independently deposited on the exposed portion of the lower semiconductor layer 46 in ohmic contact fashion as shown in FIG. 13A. Then, two electrodes of the photodiode PD are independently led out and the photodiode PD is separated from the semiconductor laser LD by the semiconductor layer 48.

While the light emitting section 1 and the photosensor section 4 are juxtaposed in fabrication as described above, the present invention is not limited thereto and the photodiode PD may be disposed also in the light emitting section 1.

An example thereof will be described below together with an example of a fabrication method thereof.

Figure 14A:
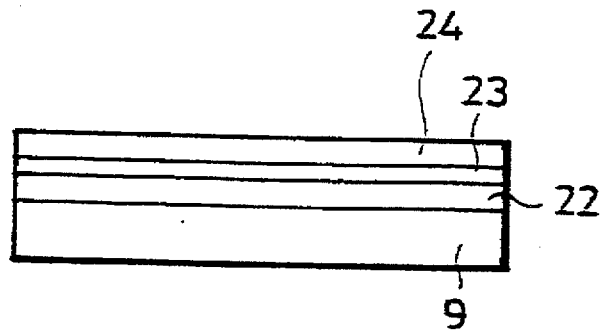
FIGS. 14A to 14C are process diagrams used to explain a further example of a method of fabricating the light emitting section and the photosensor section of the optical device according to the present invention, respectively.
Figure 14B:
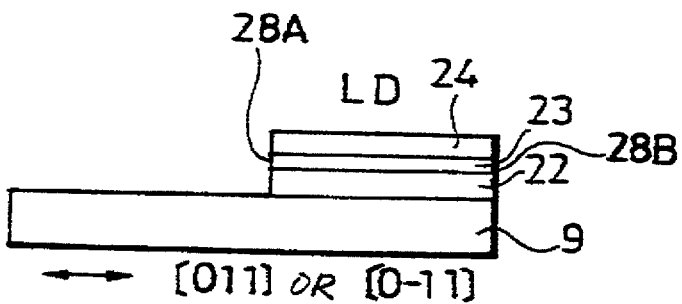

As shown in FIGS. 14A and 14B, the respective semiconductor lasers 22, 23 and 24 fabricating the semiconductor laser are formed similarly to FIGS. 11A, 11B. Then, while the fabricated portion of the semiconductor laser is left, the semiconductor layers 22, 23, 24 are processed by etching and the current blocking region is formed.

Figure 14C:
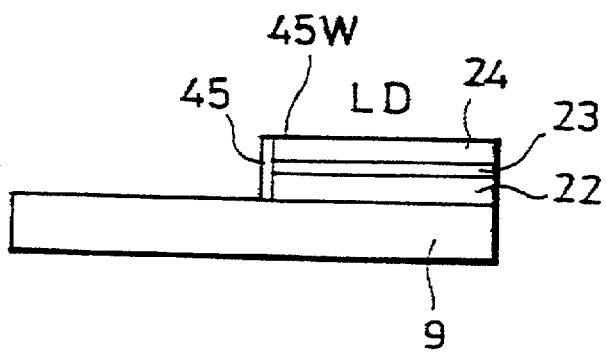

Thereafter, as shown in FIG. 14C, the mask layer 45 is formed on the end face 28A by forming an opening 45W at least on a part of the semiconductor layer 24.

Figure 15A:
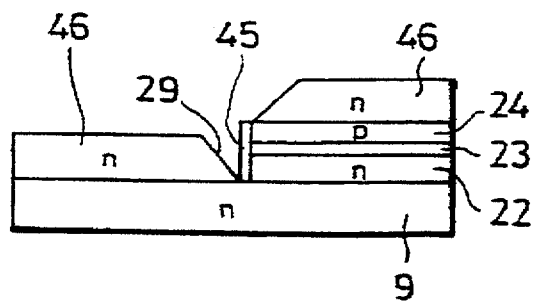
FIGS. 15A to 15C are process diagrams used to explain a further example of a method of fabricating the light emitting section and the photosensor section of the optical device according to the present invention, respectively.
Figure 15B:
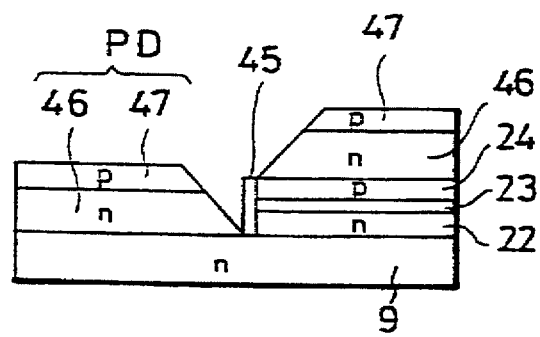
Figure 15C:
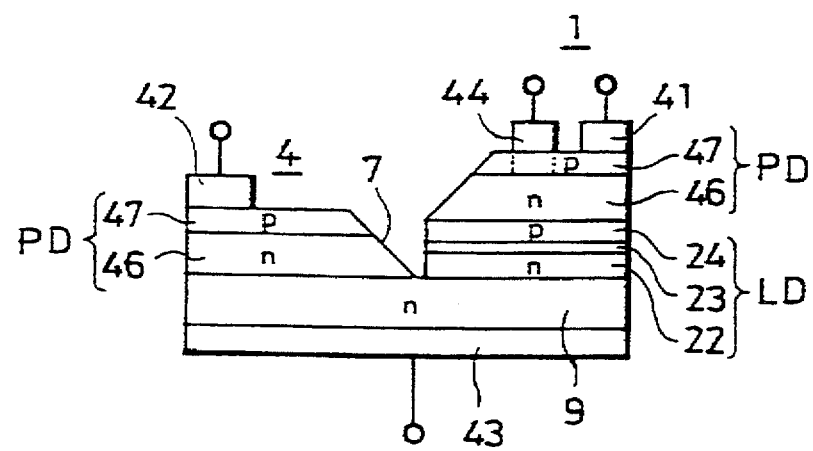

As shown in FIGS. 15A, 15B, 15C, the semiconductor layers 46, 47 are formed similarly to FIGS. 12A, 12B, 12C. At that time, the semiconductor layers 46, 47 can be formed on the semiconductor laser LD, i.e., the semiconductor layer 24 through the opening 45W of the mask layer 45 and the photodiode PD can therefore be fabricated.

Figure 16A:
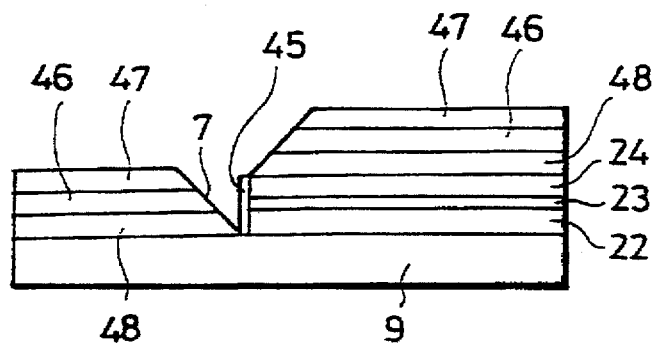
FIGS. 16A and 16B are process diagrams used to explain a further example of a method of fabricating the light emitting section and the photosensor section of the optical device according to the present invention, respectively.
Figure 16B:
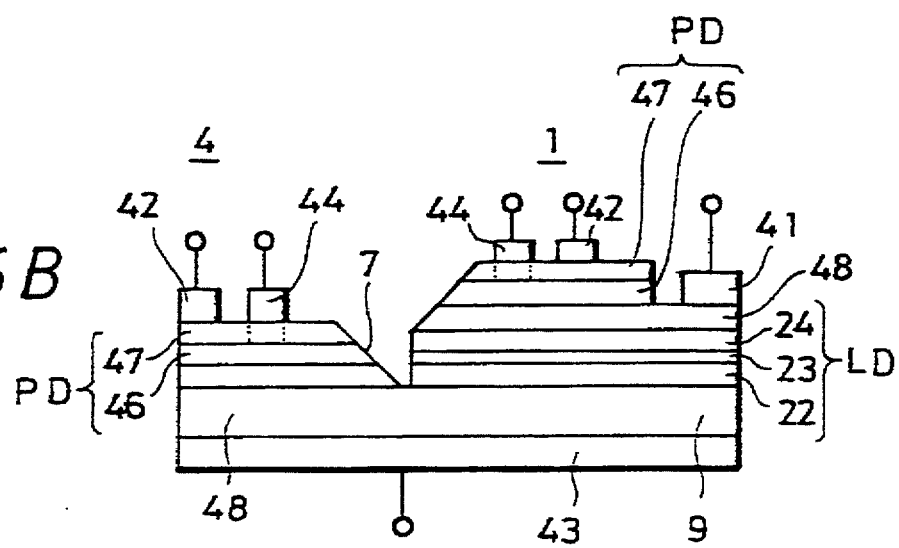

Also in this case, after the processes shown in FIGS. 14A, 14B, 14C, it is possible to fabricate the photodiode PD on the semiconductor laser LD by epitaxially growing the semiconductor layers 46, 47 fabricating the photodiode PD on the semiconductor laser LD via the semiconductor layer 48 as shown in FIGS. 16A, 16B.

In FIGS. 14A through 14C, FIGS. 15A through 15C and FIG. 16A, 16B, elements and parts identical to those of FIGS. 11A through 11C, FIGS. 12A through 12C and FIGS. 13A, 13B are marked with the same references and therefore need not be described.

The selective MOCVD might be a methyl MOCVD using TMG (trimethylgallium) as a gallium raw material gas or ethyl MOCVD using TEG (triethylgallium) as a gallium raw material gas. When the semiconductor layers 46, 47 fabricating the photodiode PD and the semiconductor layer 48 formed under the semiconductor layers 46, 47 are formed of GaAs layers, it is possible to use either an atmospheric pressure MOCVD or a low pressure MOCVD as MOCVD. If at least any one of the semiconductor layers 46, 47 and 48 is formed of an AlGaAs layer by request, a desired one of the semiconductor layers 46, 47, 48 should be epitaxially grown by the low pressure MOCVD.

Structures and placements of the light emitting section 1 and the photosensor section 4 are not limited to those described so far and may take various variations and modifications. Also, conductivity types of the respective sections may of course be selected to be opposite conductivity types.

The semiconductor laser of the light emitting section 1 is not limited to the above-mentioned device structure composed of the first and second cladding layers 22, 24 and the active layer 23 and such a device structure in which guide layers are disposed across the active layer or in which a capping layer is formed on the second cladding layer may be possible. Further, as shown in a semiconductor laser that Japanese laid-open patent publication No. 3-76218 discloses, the device structure might be a so-called SDH (separate double heterojunction) structure in which a stripe ridge extending in the [011] direction is formed on a semiconductor substrate having a {100} crystal plane as a major surface thereof, {111} B planes with low growth rate are produced on the ridge in the upper oblique direction from the edge portion thereof extending along the stripe direction by epitaxially growing at least a first cladding layer, an active layer and a second cladding layer on the semiconductor substrate and a semiconductor laser section of a triangular cross section formed by laminating the first cladding layer, the active layer and the second cladding layer sandwiched by the inclined planes of the {111}B planes is separated from the epitaxially-grown semiconductor layer formed on the groove of both sides of the ridge formed on other portion.

Figure 17:
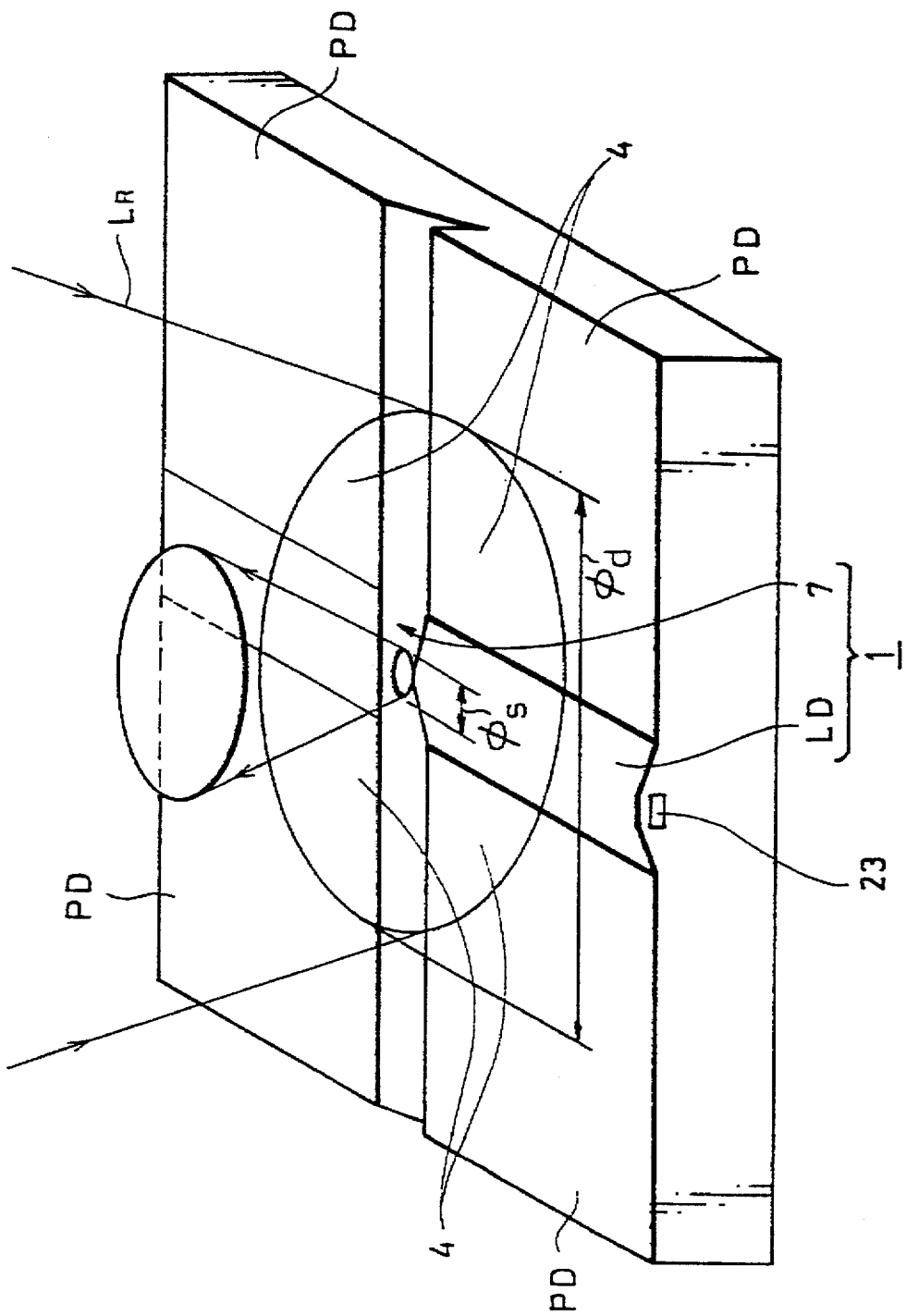
FIG. 17 is a perspective view of the optical device according to other embodiment of the present invention.

While there may be provided a single photodiode PD, if a photodiode is fabricated as a quadrant photodiode, then this quadrant photodiode can derive a tracking servo signal and a focusing servo signal. FIG. 17 schematically shows a structure of such quadrant photodiode. As shown in FIG. 17, the semiconductor laser LD fabricating the light emitting section 1 is formed as a ridge-shaped SDH device, and the reflection mirror 7 shown in FIGS. 7A through 7D and FIGS. 8A through 8C or the reflection mirror 7 based on the crystal plane shown in FIGS. 11A to 11C through FIGS. 16A, 16B is fabricated in an opposing relation to the light emitting end face of the horizontal resonator formed of the active layer 23 by RIE. Thus, light emitted from the semiconductor laser LD is reflected by the reflection mirror 7 and introduced into the radiated section (not shown). Further, four photodiodes PD are disposed around the reflection mirror 7.

Figure 18:
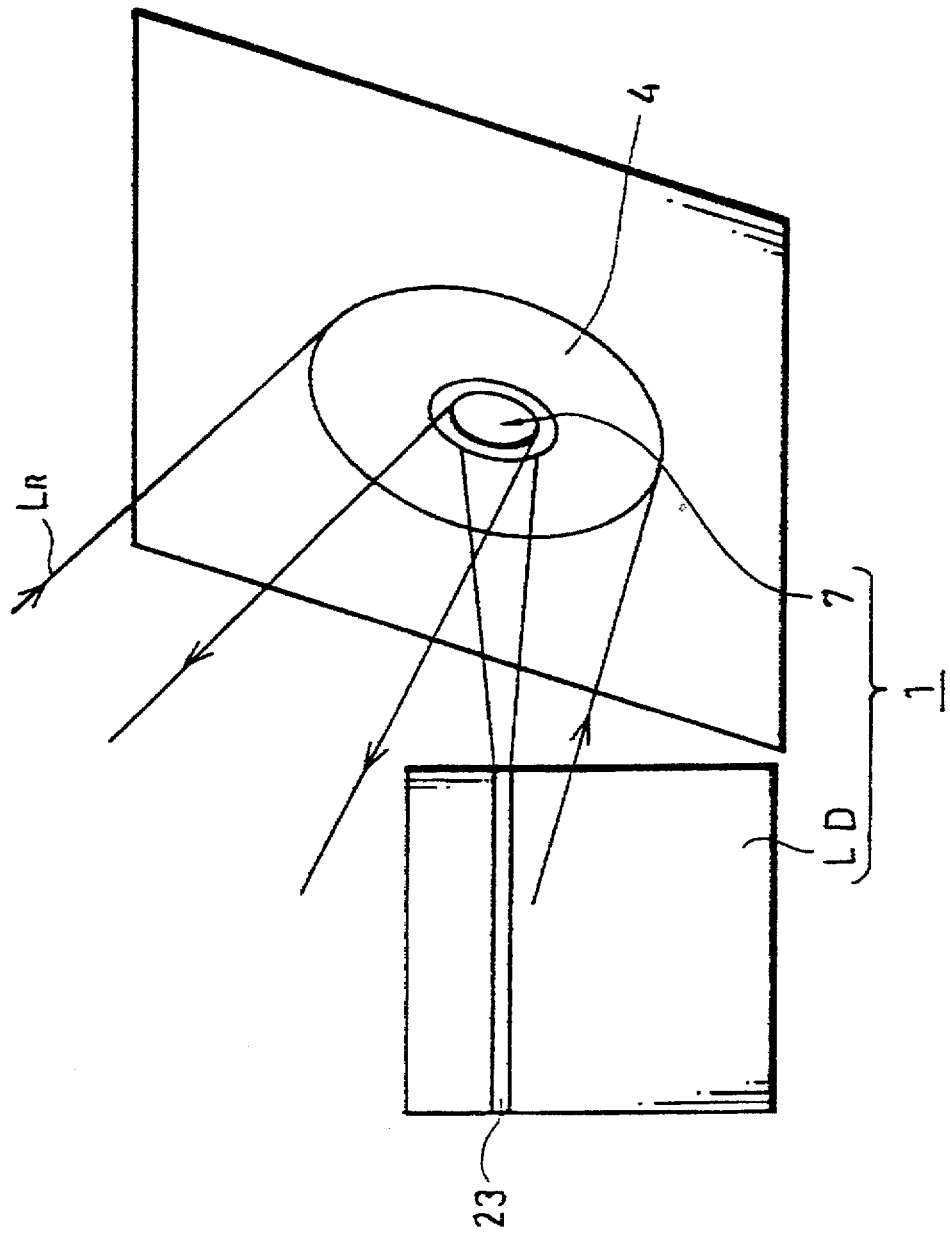
FIG. 18 is a diagram used to explain other embodiment shown in FIG. 17.

While the photosensing screen of the photosensor section and the plane on which the horizontal resonator of the semiconductor laser LD of the light emitting section 1, i.e., the active layer 23 is placed are made substantially parallel to each other as described above, as shown in a schematic placement relationship of FIG. 18, light emitted from the semiconductor laser LD may be reflected by the reflection mirror 7 which is neither perpendicular to nor parallel to the optical axis. i.e., inclined with a predetermined inclination angle and then introduced into the radiated portion (not shown). Then, the photosensing screen of the photsensor section 4 is disposed around the reflection mirror 7, i.e., light emission region.

Figure 19:
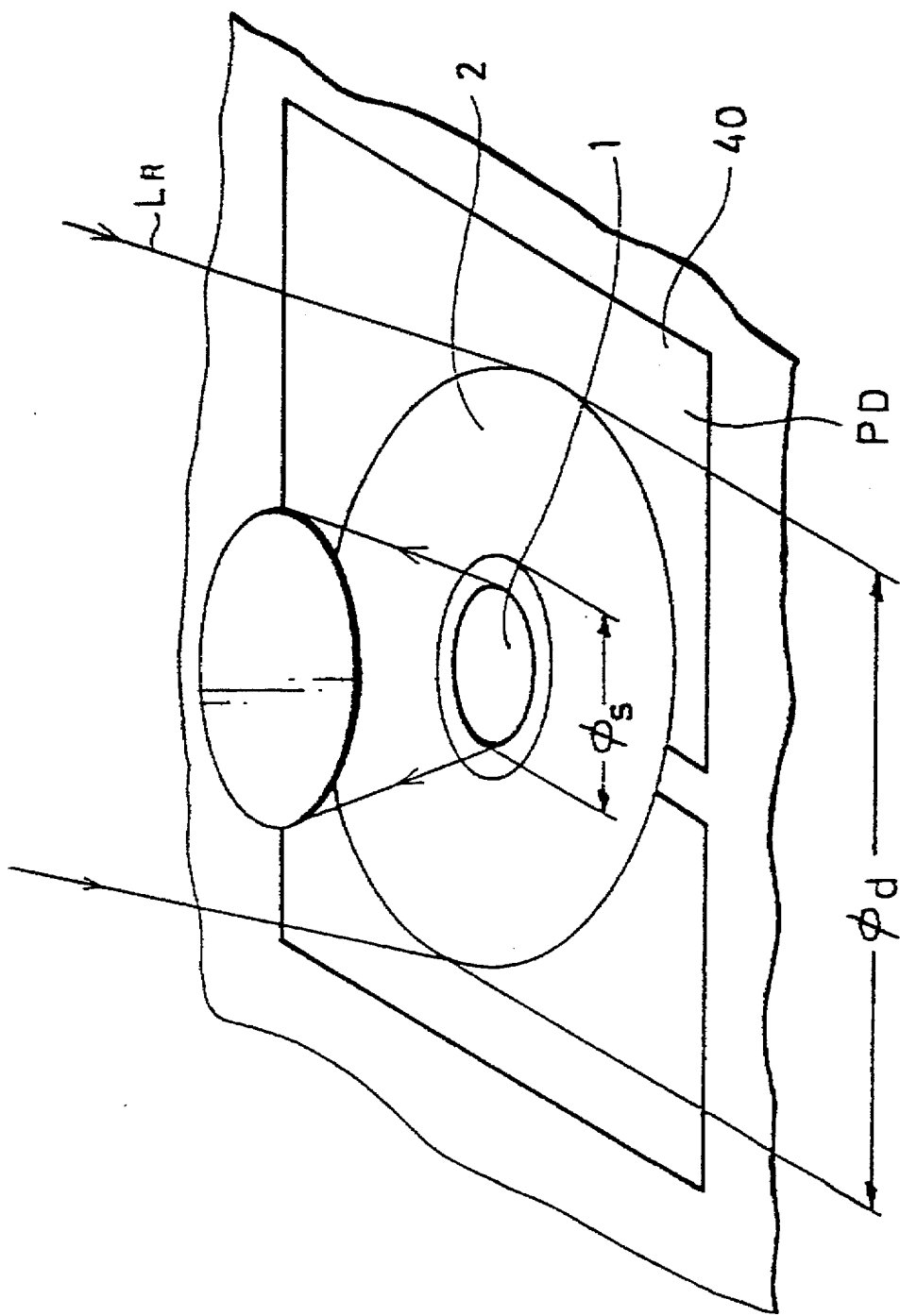
FIG. 19 is a perspective view of the optical device according to a further embodiment of the present invention.

The semiconductor laser serving as the light source of the light emitting section 1 is not limited to the semiconductor laser including the horizontal resonator to emit light in the direction extended along the substrate surface and the following variant also is possible. FIG. 19 schematically shows an example of such device structure. As shown in FIG. 19, the light emitting section 1 is formed of only a so-called surface emitting semiconductor laser of a vertical type having no reflection mirror, whereby excited laser light from the surface emitting semiconductor laser LD is directly introduced into the radiated section (not shown).

Figure 20:
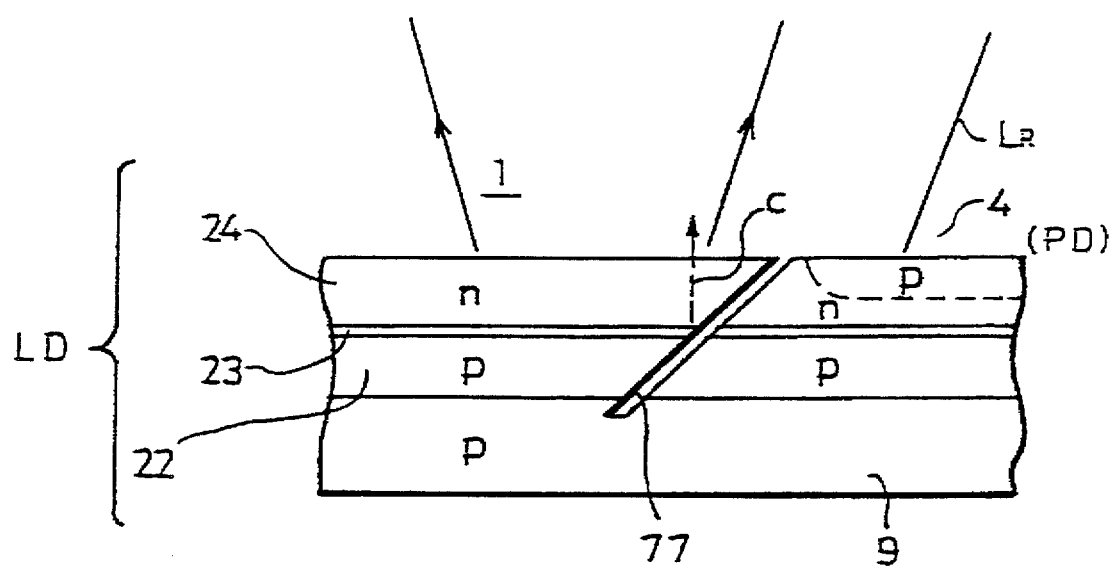
FIG. 20 is a cross-sectional view showing the optical device according to a yet further embodiment of the present invention.

Further, as shown in FIG. 20, the semiconductor laser LD is formed by epitaxially growing the p-type first cladding layer 22, the active layer 23 and the n-type second cladding layer 24 on the p-type substrate 9, and an inclined groove 77 is formed across the active layer 23 by anisotropy etching, such as RIE or the like. Therefore, laser light from the semiconductor laser is reflected on the side surface of the inclined groove 77 in the upper direction as shown by a broken arrow c in FIG. 20 and introduced into the radiated section (not shown). Then, the photodiode PD, i.e., photosensor section 4 can be fabricated by diffusing p-type impurity on a part of the semiconductor layer constructing the second cladding layer 24 within the spot region of reflected-back light converged from the radiated section to the diffraction limit and outside the light emitting region.

FIGS. 3, 5 and 6 show the examples that the reflect-back light is detected only by the photosensor section 4 disposed near the light emitting section 1, i.e., the reflected-back light containing the signal from the radiated section 2 is detected only by the photosensor section 4 and illustrate the state that the light path is not diverged at all by some suitable means, such as the beam splitter or the like. When the reflected-back light is detected by other photosensor section together with the photosensor section 4 disposed near the light emitting section 1, some suitable means, such as the beam splitter or the like can be disposed. Also in this case, since at least the photosensor section 4 can detect the reflected-back light separated from light emitted from the light emitting section 1, it is possible to detect a reading of recorded signal recorded on the optical disc and the magneto-optical disc of the radiated section 2 with high S/N (signal-to-noise ratio).

As described above, according to the optical device of the present invention, since the optical device comprises the light emitting section 1, the radiated section 2, the converging means 3 and the photosensor section 4 and light emitted from the light emitting section 1 is passed through the path of the same axis so that the photosensor section 4 can directly detect at least reflected-back light returned to the light emitting section 1, i.e., so-called final reflected-back light, at least the photosensor section 4 can detect light efficiently.

At that time, if the photosensor section 4 is disposed near the confocal of the converging means 3 and also disposed at the position in which the reflected-back light from the radiated section 2 is converged near the diffraction limit and within the range of this diffraction limit, i.e., at the position in which the distance from the optical axis a falls within 1.22λ/NA when λ is the wavelength of the light emitted from the light emitting section 1 and NA is the numerical aperture of the second converging means 32, then it is possible to enhance an efficiency with which the photosensor section 4 photosenses light.

According to the optical device structure of the present invention, since the light path of light traveled to the radiated section 2 and the light path of reflected-back light traveled to the photosensor section 4 are made on the same axis, as far as at least the photosensor section 4 is concerned, the reflected-back light need not be separated from the light path between the light emitting section 1 and the radiated section 2 by some suitable means, such as the beam splitter or the like, the number of optical assembly parts can be reduced and the optical assembly parts can be properly positioned with ease. Thus, accuracy with which respective assembly parts are assembled can be increased, the device structure can be simplified and the assembling and fabrication can be simplified. Concurrently therewith, productivity of optical devices can be increased, reliability of optical device can be improved and the overall structure of optical device can be miniaturized.

Further, since the light emitting section 1 and the photosensor section 4 are integrally fabricated, the optical and positional relationship between the light emitting section 1 and the photosensor section 4 can be set with accuracy, accuracy can be increased, accordingly, reliability can be improved. Moreover, since the photosensor section 4 can be disposed sufficiently near the light emitting section 1, the photosensor section 4 can photosense the reflected-back light returned to the light emitting section 1 more efficiently.

While a method of detecting a reflected-back light by a semiconductor laser itself of a light emitting device, i.e., so-called SCOOP (self coupled optical pick-up) has been proposed so far, in this case, a reflected-back light is detected by detecting the change of a laser operation voltage and the change of light output by a monitor photodiode. Therefore, a signal processing thereof becomes complex and the optical device is low in S/N. According to the optical device structure of the present invention, since the light emitting section 1 and the photosensor section 4 are separated and the reflected-back light is directly detected by the photosensor section 4, the signal processing becomes simple and the optical device according to the present invention is excellent in S/N. Furthermore, the light emitting section 1 and the photosensor section 4 can function as a so-called confocal laser coupler.

As set out above, according to the present invention, if the optical device of the present invention is applied to the optical pickup device for the optical recording media, such the optical disc and the magneto-optical disc, then the optical pickup device can be simplified in structure. Also, the overall structure of the such optical pickup device can be miniaturized, the fabrication thereof can be simplified and reliability of the optical pickup device can be improved. Further, a quantity of reflected-back light, i.e., a quantity of light photosensed by the photosensor section 4 can be increased, whereby the output can be increased and the light emitting light source can be driven with a low power, accordingly, a power consumption of the optical device can be reduced. As described above, the optical device according to the present invention can bring great industrial advantages in actual practice and there can be achieved a large advantage when the optical device according to the present invention is used.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An optical device comprising:

a light emitting section;

a radiated section;

converging means; and a photosensor section, wherein light emitted from said light emitting section is converged and radiated on said radiated section by said converging means, said photosensor section is disposed near a confocal of said converging means concerning reflected-back light from said radiated section, and light from said light emitting section is passed through a path of the same axis without being diverted there from and photosensed by said photosensor section before and after said light is reflected on said radiated section.

2. An optical device according to claim 1, wherein said light emitting section includes a reflection mirror and a semiconductor laser and a resonator of said semiconductor laser is opposed to said reflection mirror.

3. An optical device according to claim 1, wherein said light emitting section and said photosensor section are integrally formed on a common substrate, said light emitting section includes a semiconductor laser having a horizontal resonator and a reflection mirror, said photosensor section is formed of a photodiode and light emitted from said horizontal resonator of said semiconductor laser is reflected by said reflection mirror so that said emitted light coincides with a path oriented toward said radiated section.

4. An optical device according to claim 1, wherein said reflected-back light traveling toward said photosensor section is converged within a light diffraction limit, wherein said diffraction limit is $1.22\lambda/NA$ where $\lambda$ is the wavelength of the light emitted from the light emitting section and NA is the numerical aperture of said converging means.

5. An optical device according to claim 1, wherein at least a part of a photosensor screen of said photosensor section is disposed at a position in which a distance from an optical axis of said emitted light intersecting a placement reference plane of said photosensor screen falls within $1.22\lambda/NA$ where $\lambda$ is a wavelength of light emitted from said light emitting section and NA is a numerical aperture of said converging means.

6. An optical device according to claim 1, wherein said converging means is composed of first and second converging means.

7. An optical device according to claim 6, wherein said polarizing means is disposed between said first and second converging means.

8. An optical device according to claim 6, wherein said second converging means is a collimator lens.

9. An optical device according to claim 6, wherein at least a part of a photosensor screen of said photosensor section is disposed at a position in which a distance from an optical axis of said emitted light intersecting a placement reference plane of said photosensor screen falls within $1.22\lambda/NA$ where $\lambda$ is a wavelength of light emitted from said light emitting section and NA is a numerical aperture of said second converging means.

10. An optical device comprising:

a light emitting section;

a radiated section;

converging means;

a photosensor section; and magneto-optical signal detecting means, wherein light emitted from said light emitting section is converged and radiated on said radiated section by said converging means, reflected-back light reflected on said radiated section is converged by said converging means, said photosensor section is disposed near a confocal of said converging means concerning reflected-back light from said radiated section, and light from said light emitting section is passed through a path of the same axis without being diverted there from and photosensed by said photosensor section before and after said light is reflected on said radiated section.

11. An optical device according to claim 10, wherein said magneto-optical signal detecting means includes at least one of polarizing means and analyzing means.

12. An optical device according to claim 11, wherein said polarizing means is disposed between said light emitting section and said radiated section, and said analyzing means is disposed on said photosensor section.

13. An optical device comprising:

a light emitting section;

a photosensor section; and a common substrate in which said light emitting section and said photosensor section are integrally formed, wherein said light emitting section includes a semiconductor laser having a horizontal resonator and a reflection mirror, said photosensor section is formed of a photodiode and at least a part of said photodiode is disposed within a diffraction limit of reflected-back light from said light emitter section, wherein said diffraction limit is $1.22\lambda/NA$ where $\lambda$ is the wavelength of the light emitted from the light emitting section and NA is the numerical aperture of a converging means interposed in the path of light from said light emitting section to said photosensor section.

* * * * *